United States Patent
Yang et al.

(10) Patent No.: US 10,269,815 B2
(45) Date of Patent: Apr. 23, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: ShihKuang Yang, Tainan (TW); Hung-Ling Shih, Tainan (TW); Chieh-Fei Chiu, Tainan (TW); Po-Wei Liu, Tainan (TW); Wen-Tuo Huang, Tainan (TW); Yu-Ling Hsu, Tainan (TW); Yong-Shiuan Tsair, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/498,743

(22) Filed: Apr. 27, 2017

(65) Prior Publication Data
US 2018/0315764 A1 Nov. 1, 2018

(51) Int. Cl.
| H01L 21/04 | (2006.01) |
| H01L 27/11521 | (2017.01) |
| H01L 29/423 | (2006.01) |
| H01L 21/306 | (2006.01) |
| H01L 21/3065 | (2006.01) |

(52) U.S. Cl.
CPC .... *H01L 27/11521* (2013.01); *H01L 21/3065* (2013.01); *H01L 21/30625* (2013.01); *H01L 29/42344* (2013.01)

(58) Field of Classification Search
None
See application file for complete search history.

(56) References Cited

U.S. PATENT DOCUMENTS 9,276,006 B1    3/2016 Chen et al.
9,343,472 B2 *  5/2016 Tan ............... H01L 27/11521
(Continued)

FOREIGN PATENT DOCUMENTS

| KR | 10-2008-0006897 A | 1/2008 |
| KR | 10-2015-0038701 A | 4/2015 |
| WO | 2014/031286 A2 | 2/2014 |

OTHER PUBLICATIONS

German Office Action issued in corresponding German Application No. 10 2017 110 443.7, dated Jan. 16, 2018.

*Primary Examiner* — Ali Naraghi
(74) *Attorney, Agent, or Firm* — McDermott Will & Emery LLP

(57) ABSTRACT

A semiconductor device includes a non-volatile memory. The non-volatile memory includes a first dielectric layer disposed on a substrate, a floating gate disposed on the dielectric layer, a control gate, a second dielectric layer disposed between the floating gate and the control gate, sidewall spacers disposed on opposing sides of a stacked structure including the floating gate, the second dielectric layer and the control gate, and an erase gate and a select gate disposed on sides of the stacked structure, respectively. An upper surface of the erase gate and one of the sidewall spacers in contact with the erase gate form an angle θ1 at a contact point of the upper surface of the erase gate and the one of the sidewall spacers, where 90°<θ1<115° measured from the upper surface of the erase gate.

20 Claims, 16 Drawing Sheets

(56) References Cited

U.S. PATENT DOCUMENTS

| | | |
|---|---|---|
| 2013/0207174 A1 | 8/2013 | Wang et al. |
| 2014/0057422 A1* | 2/2014 | Liu .................. H01L 21/26586 |
| | | 438/510 |
| 2014/0264539 A1 | 9/2014 | Do et al. |
| 2015/0104915 A1 | 4/2015 | Tan et al. |
| 2016/0148944 A1 | 5/2016 | Yu et al. |
| 2016/0163552 A1 | 6/2016 | Hsu et al. |
| 2017/0062446 A1 | 3/2017 | Kodama et al. |

* cited by examiner

SEMICONDUCTOR DEVICE AND MANUFACTURING METHOD THEREOF

TECHNICAL FIELD

The disclosure relates to semiconductor integrated circuits, more particularly to semiconductor devices including non-volatile memory cells, and manufacturing processes thereof.

BACKGROUND

As the semiconductor industry has progressed into nanometer technology process nodes in pursuit of higher device density, higher performance, and lower costs, there have been challenges in reducing contact resistance and suppressing an increase of the number of lithography operations.

BRIEF DESCRIPTION OF THE DRAWINGS

The present disclosure is best understood from the following detailed description when read with the accompanying figures. It is emphasized that, in accordance with the standard practice in the industry, various features may not be drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral circuits such as logic circuits. The NVM cells generally require a stacked structure in which plural layers, such as polysilicon layers, are stacked. Further, various planarization operations, such as an etch-back operation or a chemical mechanical polishing (CMP) operation, are performed to form desired layers or patterns of the NVM cells.

FIGS. 1-15 generally show cross sectional views illustrating a sequential process for manufacturing a semiconductor device including non-volatile memory cells according to one embodiment of the present disclosure. It is understood that additional operations can be provided before, during, and after processes shown by FIGS. 1-15, and some of the operations described below can be replaced or eliminated, for additional embodiments of the method. Some elements may not be illustrated for simplicity. The order of the operations may be changeable.

Figure 1:
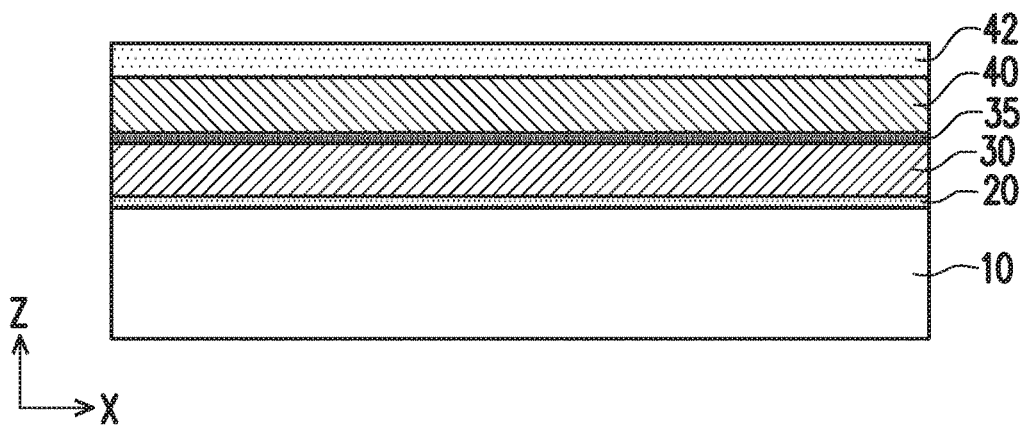
FIG. 1 shows a cross sectional view illustrating one of the various stages of a sequential semiconductor device manufacturing process according to embodiments of the present disclosure.

As shown in FIG. 1, a first dielectric layer 20, which is to be used as a tunnel dielectric layer of NVM cells, is formed on a substrate, and a first polysilicon layer 30, which is to be used as a floating gate of the NVM cell, is formed over the first insulating layer 20. Further, a second dielectric layer 35, a second polysilicon layer 40, which is to be used as a control gate of the NVM cell, and a mask layer (cap insulating layer) 42 are sequentially formed over the first polysilicon layer.

In some embodiments, the substrate 10 is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise: another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

The first dielectric layer 20 utilized as a tunnel oxide layer for NVM cells is made of silicon oxide. The thickness of the first dielectric layer 20 is in a range from about 1 nm to about 50 nm in some embodiments. The first dielectric layer 20 can be formed by thermal oxidation or chemical vapor deposition (CVD).

The first polysilicon layer 30 can be formed by CVD. The thickness of the first polysilicon layer 30 as deposited is in a range from about 20 nm to about 200 nm in some embodiments. In some embodiments, the thickness of the first polysilicon layer 30 is reduced by a planarization operation, such as CMP or an etch-back method. After the planarization operation, the thickness of the first polysilicon layer 30 is in a range from about 10 nm to about 50 nm in some embodiments. The first polysilicon layer 30 is appropriately doped with impurities. The first polysilicon layer 30 may be replaced with an amorphous silicon layer.

The second dielectric layer 35 includes a silicon oxide layer, a silicon nitride layer or multilayers of silicon oxide and silicon nitride. In one embodiment, a silicon oxide-silicon nitride-silicon oxide (ONO) layer is used as the second dielectric layer 35. The thickness of the second dielectric layer is in a range from about 1 nm to about 100 nm in some embodiments. The second dielectric layer 35 can be formed by CVD, physical vapor deposition (PVD) or atomic layer deposition (ALD).

The second polysilicon layer 40 can be formed by CVD, and the thickness of the second polysilicon layer 40 is in a range from about 10 nm to about 100 nm, in some embodiments.

The hard mask layer 42 may be made of silicon oxide formed by CVD, and the thickness thereof may be in a range from about 10 nm to about 200 nm. In some embodiments, the hard mask layer 42 includes three layers, for example, a lower layer 42-1 made of silicon nitride, a middle layer 42-2 made of silicon oxide and an upper layer 42-3 made of silicon nitride (see, FIGS. 7 and 9B). In other embodiments, the lower layer 42-1 is made of silicon oxide, the middle layer 42-2 is made of silicon nitride, and the upper layer 42-3 is made of silicon oxide. In certain embodiments, the middle layer is made of different material than the lower and upper layers. The thickness of the lower layer 42-1 is in a range of about 2 nm to about 10 nm, the thickness of the middle layer 42-2 is in a range of about 5 nm to about 100, and the thickness of the upper layer 42-3 is in a range of about 2 nm to about 50 nm, in some embodiments.

Figure 2:
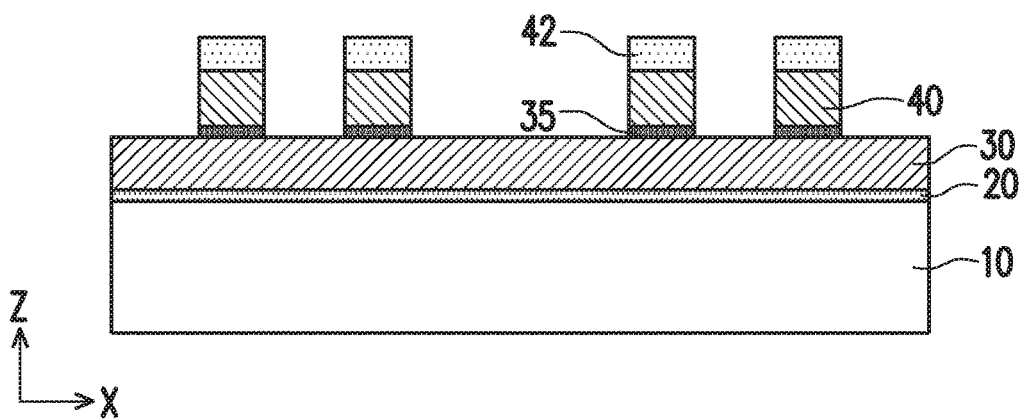
FIG. 2 shows a cross sectional view illustrating one of the various stages of a sequential semiconductor device manufacturing process according to embodiments of the present disclosure.

Next, by using a patterning operation including lithography and etching, the hard mask layer 42 is patterned, and by using the patterned hard mask layer as an etching mask, the second polysilicon layer 40 and the second dielectric layer 35 are patterned as shown in FIG. 2.

Figure 3:
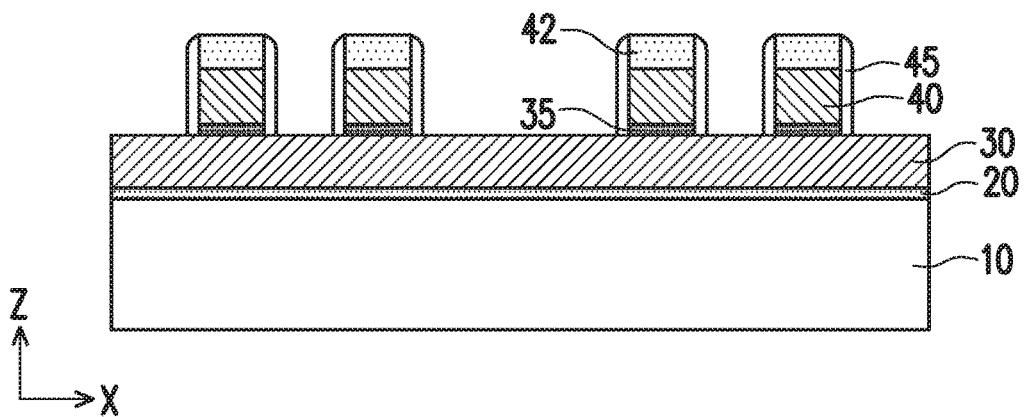
FIG. 3 shows a cross sectional view illustrating one of the various stages of a sequential semiconductor device manufacturing process according to embodiments of the present disclosure.

After the patterning operation of the second polysilicon layer 40 and the second dielectric layer 35, first sidewall spacers 45 are formed on opposing sides of the patterned second polysilicon layer 40 and second dielectric layer 35, as shown in FIG. 3.

The first sidewall spacers 45 are made of one or more layers of suitable dielectric material. One or more blanket layers of dielectric material are formed, for example by CVD, over the entire substrate and then anisotropic etching is performed, thereby forming the first sidewall spacers 45. The thickness of the first sidewall spacers 45 is in a range from about 20 nm to about 60 nm in some embodiments.

Figure 7:
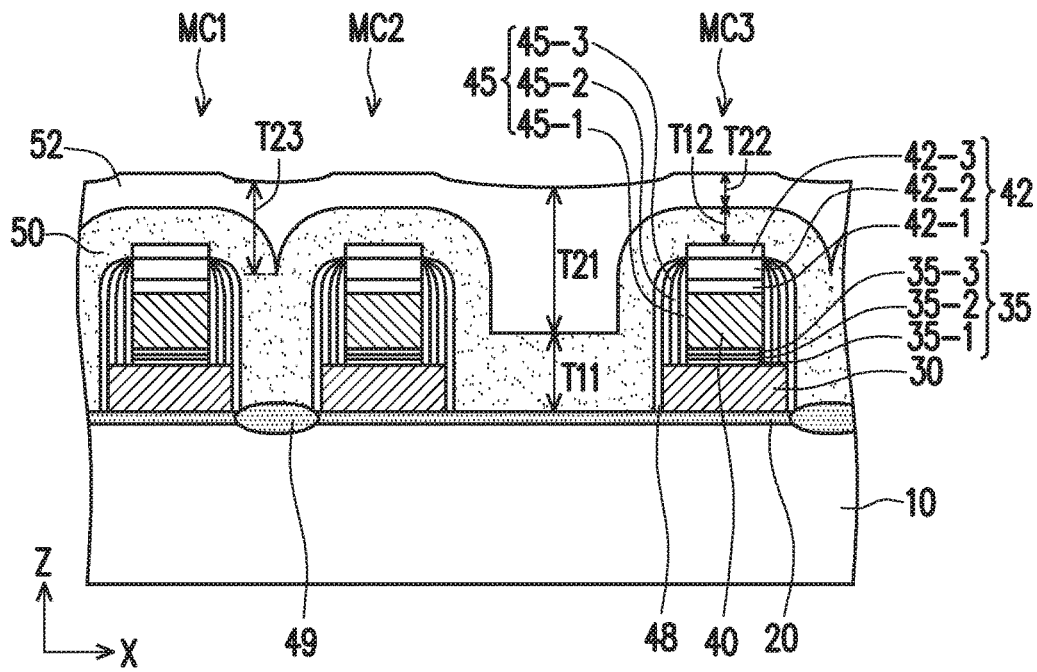
FIG. 7 shows a cross sectional view illustrating one of the various stages of a sequential semiconductor device manufacturing process according to embodiments of the present disclosure.
Figure 9A:
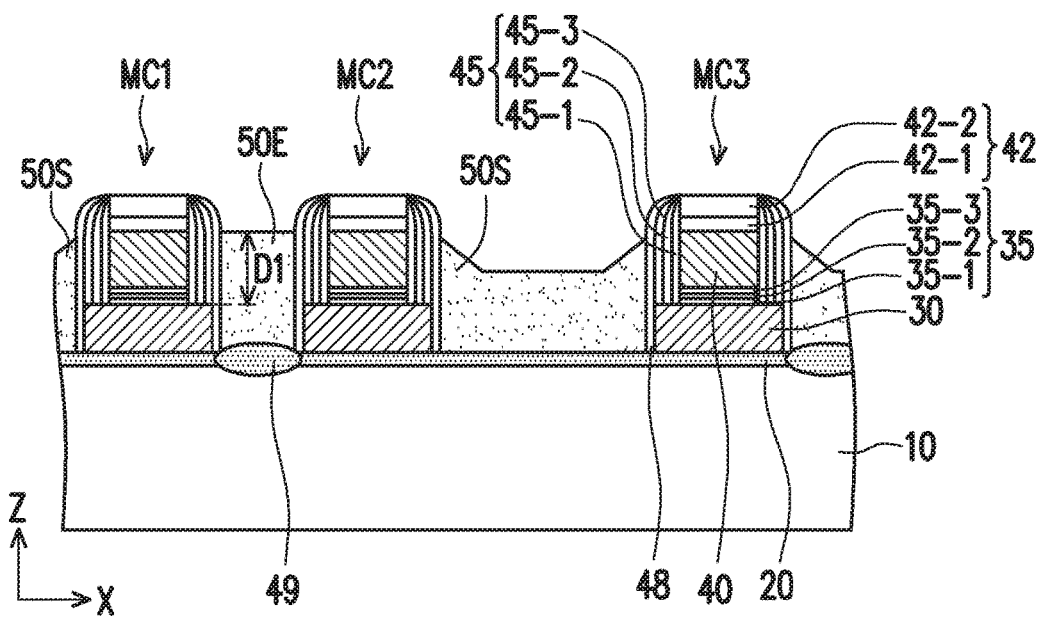
FIG. 9A shows a cross sectional view illustrating one of the various stages of a sequential semiconductor device manufacturing process according to embodiments of the present disclosure.
Figure 9B:
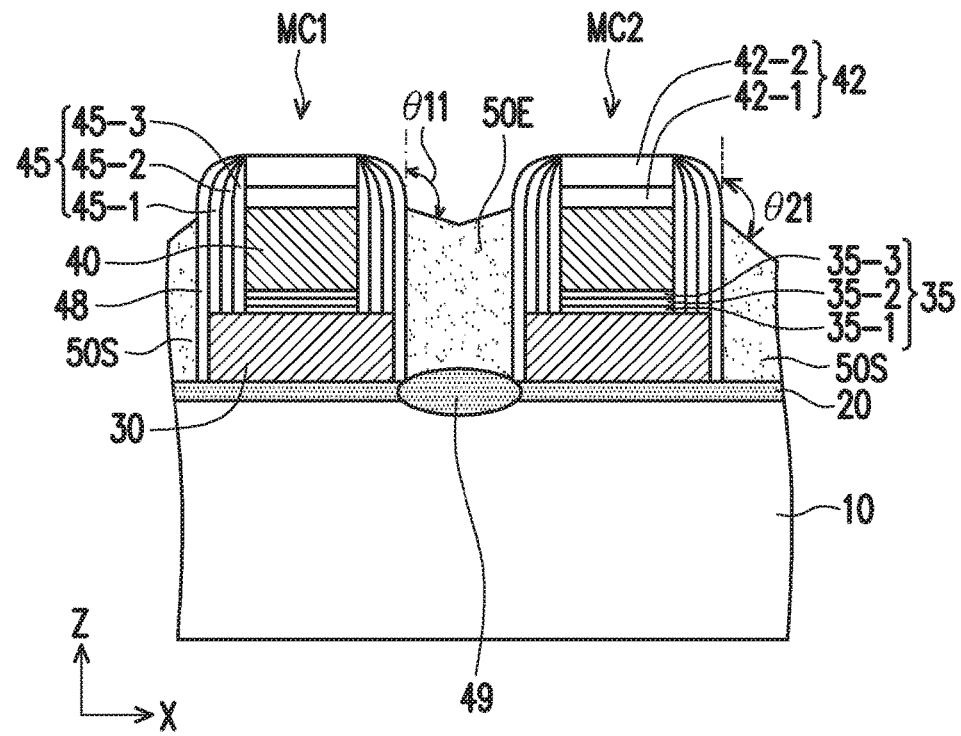
FIGS. 9B-9D show cross sectional views according to various embodiments of the present disclosure.

In some embodiments, the first sidewall spacers 45 include an ONO film having a silicon nitride layer 45-2 sandwiched by two silicon oxide layers 45-1 and 45-3, as shown in FIGS. 7 and 9B. The thicknesses of the silicon oxide layer 45-1, the silicon nitride layer 45-2 and the silicon oxide layer 45-3 are in ranges of about 1-20 nm, about 1-30 nm and about 1-20 nm, respectively, in some embodiments. In certain embodiments, the first sidewall spacers 45 are a single layer of silicon nitride or silicon oxynitride.

Figure 4:
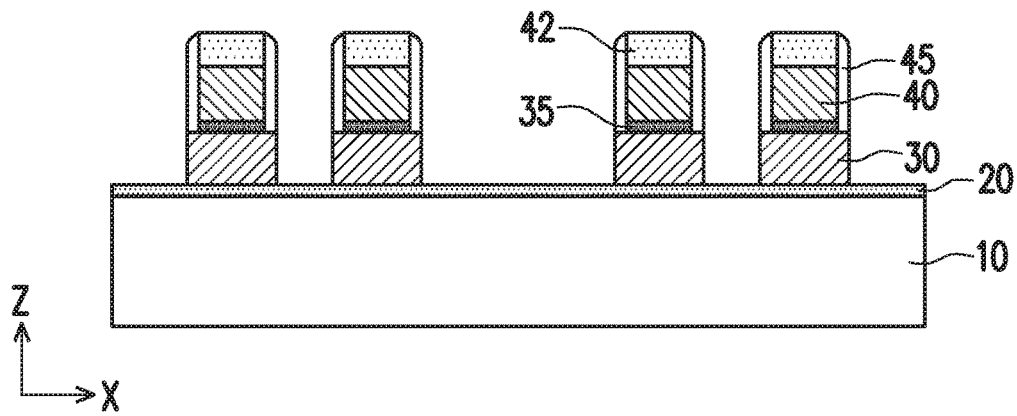
FIG. 4 shows a cross sectional view illustrating one of the various stages of a sequential semiconductor device manufacturing process according to embodiments of the present disclosure.

After the first sidewall spacers 45 are formed, the first polysilicon layer 30 is patterned by using dry etching operations, as shown in FIG. 4.

Figure 5:
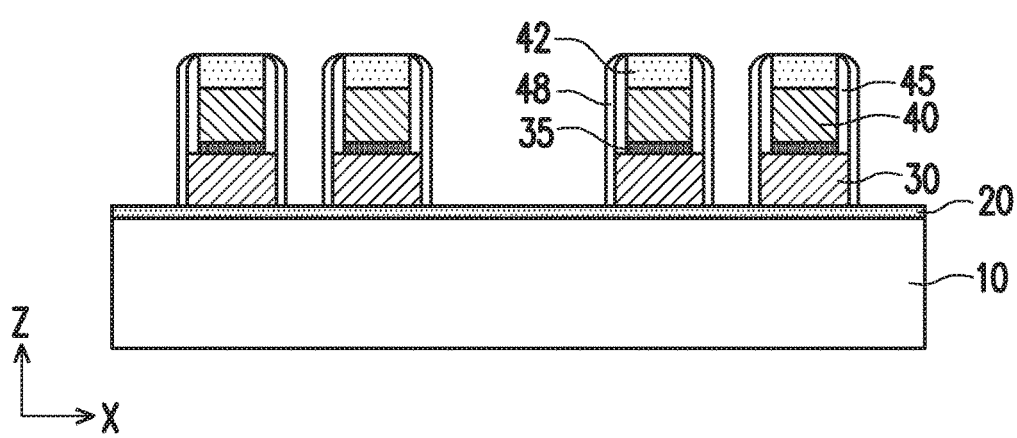
FIG. 5 shows a cross sectional view illustrating one of the various stages of a sequential semiconductor device manufacturing process according to embodiments of the present disclosure.
Figure 6:
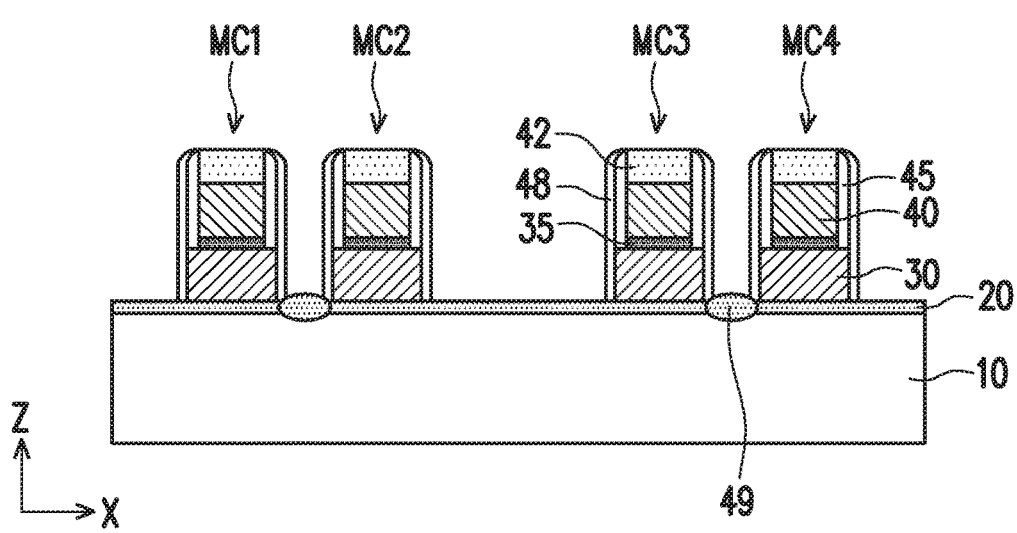
FIG. 6 shows a cross sectional view illustrating one of the various stages of a sequential semiconductor device manufacturing process according to embodiments of the present disclosure.

Further, second sidewall spacers 48 are formed as shown in FIG. 5, and an erase-gate oxide 49 is formed as shown in FIG. 6. The second sidewall spacers 48 are made of one or more layers of dielectric material. In one embodiment, the second sidewall spacers 48 are made of silicon oxide formed by CVD. The erase-gate oxide 49 is made of silicon oxide. In some embodiments, a silicon oxide layer is formed and then the silicon oxide layer is patterned to remove the silicon oxide layer from an erase gate area, and then wet oxidation is performed, thereby forming the erase-gate oxide 49. In certain embodiments, a gate dielectric layer for select gates (word line) is also formed. In some embodiments, the first dielectric layer 20 remains as the gate dielectric layer, and in certain embodiments, the first dielectric layer 20 to be used as the gate dielectric layer for the select gates are thinned.

By the foregoing operations, stacked structures MC1, MC2, MC3 and MC4 are formed as shown in FIG. 6. The stacked structures MC1 and MC2 are to be a pair of memory cells and the stacked structures MC3 and MC4 are to be another pair of memory cells. The distance between the stacked structures MC1 and MC2 is equal to the distance between the stacked structures MC3 and MC4, and smaller than the distance between the stacked structures MC2 and MC3.

Then, as shown in FIG. 7, a third polysilicon layer 50 is formed over the structure of FIG. 6 and a planarization layer 52 is formed over the third polysilicon layer 50. The thickness T11 of the third polysilicon layer 50 measured at a flat portion between stacked structures MC2 and MC3 is in a range from about 40 nm to about 200 nm in some embodiments. In certain embodiments, the thickness T12 of the third polysilicon layer 50 measured at the top of the hard mask layer 42 is in a range from about 40 nm to about 100 nm. After the third polysilicon layer 50 is formed the height of the stacked structure is about 200 nm to about 400 nm in some embodiments.

The third polysilicon layer 50 is conformally formed by CVD, as shown in FIG. 7, and a large gap (the flat portion) is formed between the stacked structures MC2 and MC3. On the other hand, the planarization layer 52 can be formed to fill the large gap.

In some embodiments, the planarization layer 52 is made of organic material having low viscosity. In certain embodiments, the planarization layer 52 is made of one or more layers of a photo resist or a bottom anti-reflective-coating (BARC) used as an underlying layer of a photo resist in a lithography operation. The BARC generally has an attenuation coefficient (k-factor) between about 0.2 to about 0.6 for 248 nm and/or 193 nm light.

The thickness T21 of the planarization layer 52 measured at a flat portion is in a range from about 100 nm to 300 nm in some embodiments. In certain embodiments, the thickness T22 of the planarization layer 52 measured above the hard mask layer 42 is in a range from about 20 nm to about 50 nm, and the thickness T23 of the planarization layer 52 measured at the middle point of the two stacked structures (above the center of the control gate to be formed) is in a range from about 40 nm to about 100 nm.

Figure 8:
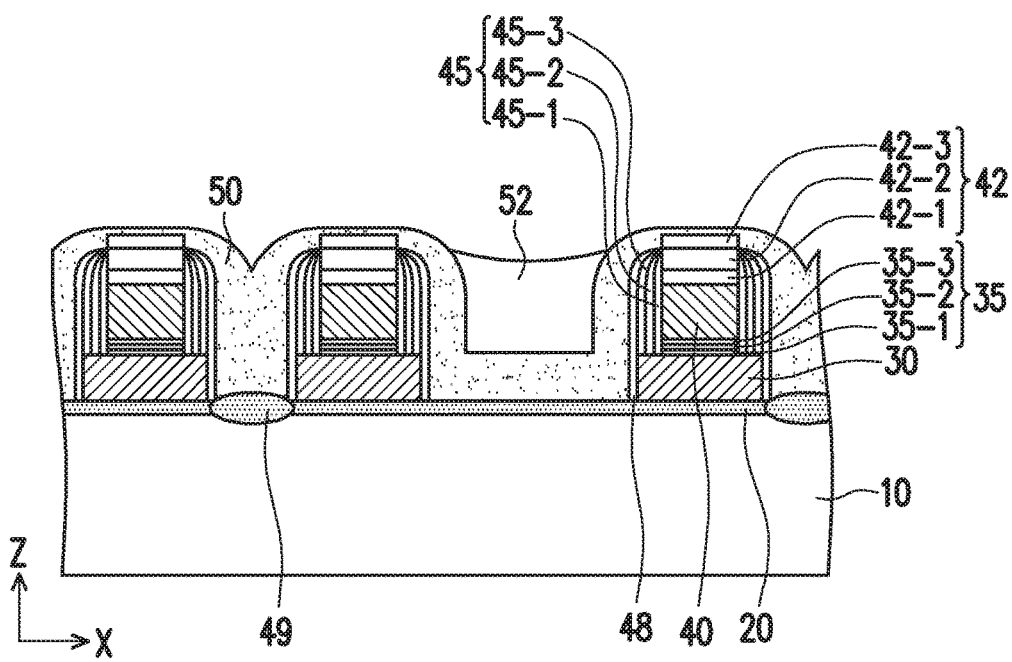
FIG. 8 shows a cross sectional view illustrating one of the various stages of a sequential semiconductor device manufacturing process according to embodiments of the present disclosure.

Then, as shown in FIG. 8, a first etch-back operation is performed to remove an upper portion of the third polysilicon layer 50, by using plasma dry etching.

The etch-back operation is performed under the condition that the etching rate ER1 of the polysilicon is close to the etching rate ER2 of the planarization layer 52. In some embodiments, $0.5 < ER1/ER2 < 2.0$, and in other embodiments, $1/1.5 < ER1/ER2 < 1.5$. For example, a plasma process using HBr and $CF_4$ at a pressure about 0.2 to about 5 mTorr is employed in the etch-back operation.

After the first etch-back operation, a second etch back operation is performed to further reduce the thickness of the third polysilicon layer 50, as shown in FIGS. 9A and 9B. By the second etch-back operation, an erase gate 50E and a select gate (word line) 50S are formed.

Based on the conditions of the first and second etch-back operations, the surface profile of the erase gate and the select gate is determined. In particular, the condition of the first etch-back operation substantially determines the surface profile of the erase gate and the select gate.

As shown in FIG. 9A, the erase gate 50E is disposed between a pair of stacked structures MC1, MC2 and the select gate 50S are disposed on the opposing sides of the pair of stacked structures where the erase gate 50E is not formed. As shown in FIG. 9A, it is noted that at this stage of the manufacturing process, the select gate 50S of one pair of the stacked structures MC1, MC2 is connected to (not divided from) the select gate 50S of an adjacent of the pair of the stacked structures (MC3) as shown in FIG. 9A.

In some embodiments, as shown in FIG. 9B, an upper surface of the erase gate 50E (polysilicon layer 50) and one of the second sidewall spacers 48 (e.g., the right side of the structure MC1) in contact with the erase gate 50E form an angle $\theta 11$ at a contact point of the upper surface of the erase gate 50E and the one of the sidewall spacers 48, where $90° < \theta 11 < 120°$ measured from the upper surface of the erase gate. In other embodiments, where $90° < \theta 11 < 115°$.

Further, the thickness D1 of the erase gate 50E measured from a level of the upper surface of the floating gate (polysilicon layer 30) to the contact point is sufficiently large to cover the sidewall spacer 48 covering the control gate 40. In some embodiments, the thickness D1 is greater than the sum of the thicknesses of the second dielectric layer 35 and the control gate (second polysilicon layer 40).

Similarly, as shown in FIG. 9B, the upper surface of the select gate 50S (polysilicon layer 50) and one of the second sidewall spacers 48 (e.g., the right side of the structure MC2) in contact with the select gate 50S form an angle $\theta 21$ at a contact point of the upper surface of the select gate 50S and the one of the sidewall spacers 48, where $90° < \theta 21 < 130°$ measured from the upper surface of the select gate. In other embodiments, $90° < \theta 21 < 125°$. $\theta 21 > \theta 11$ in some embodiments.

If the etching rate ER1 of the polysilicon is greater than the etching rate ER2 of the planarization layer, for example, $5.0 < ER1/ER2$ in the first etch-back operation, the angle $\theta 11$ would become less than 90°, forming a reverse V-shape or a convex shape at the surface of the erase gate, and D1 would be less than the sum of the thicknesses of the second dielectric layer 35 and the control gate (second polysilicon layer 40), which would degrade endurance properties and make an erase operation slower. In some embodiments, D1 is in a range from about 45 nm to about 80 nm.

In contrast, in some embodiments of the present disclosure, the endurance property can be improved by about 40% in terms of a voltage shift between an initial state and a post-stress state, and the cell erase time can be improved by about 20%.

Figure 9C:
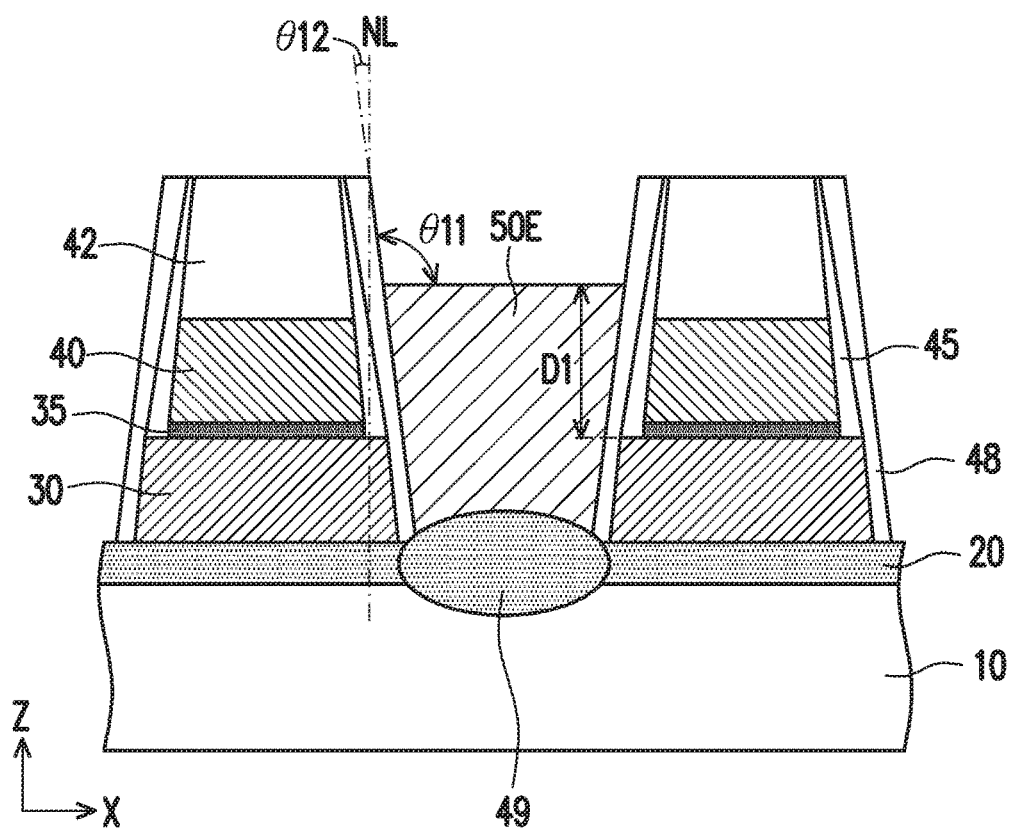
Figure 9D:
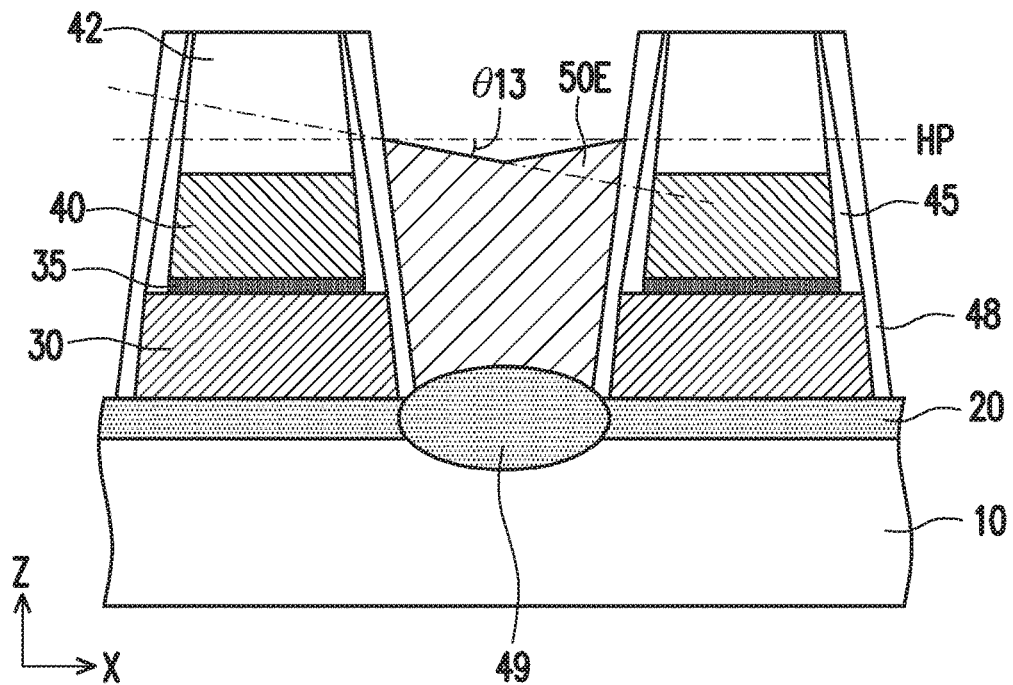

FIGS. 9C and 9D show cross sectional views according to other embodiments. In FIGS. 9C and 9D, the stacked structure including the control gate 40 and the hard mask layer 42 has a trapezoid cross section along the X direction and thus one of the sidewall spacers 48, which is in contact with the erase gate 50E is inclined toward the select gate 50S side with respect to a normal line NL perpendicular to the principal surface of the substrate 10, making an angle θ12 between the one of the sidewall spacers 48 and the normal line NL, as shown in FIG. 9C. In some embodiments, 0°<θ12<15° measured from the normal line NL, and 0°<θ12<10° measured from the normal line NL in other embodiments. As shown in FIG. 9C, the upper surface of the erase gate 50E is substantially flat (variation is less than 3 nm) with respect to the principal surface of the substrate 10, while 90°<θ11<115°.

Further, in FIG. 9D, the upper surface of the erase gate 50E and a horizontal plane HP parallel to the surface of the substrate 10 makes an angle θ13 at the contact point of the upper surface of the erase gate 50E and the one of the sidewall spacers 48, where −20°<θ13<15° measured from the horizontal plane in some embodiments, and θ13 being less than 0° means that the thickness of the third polysilicon layer of the erase gate 50E decreases as the distance from the one of the sidewall spacers increases, forming a V-Shape (U-shape and/or concave shape) cross section in the X direction. In other embodiments, −15°<θ13<10°.

Similar to FIG. 9B, with the structures of FIGS. 9C and 9D, the endurance property can be improved and the cell erase time can be improved.

Figure 10:
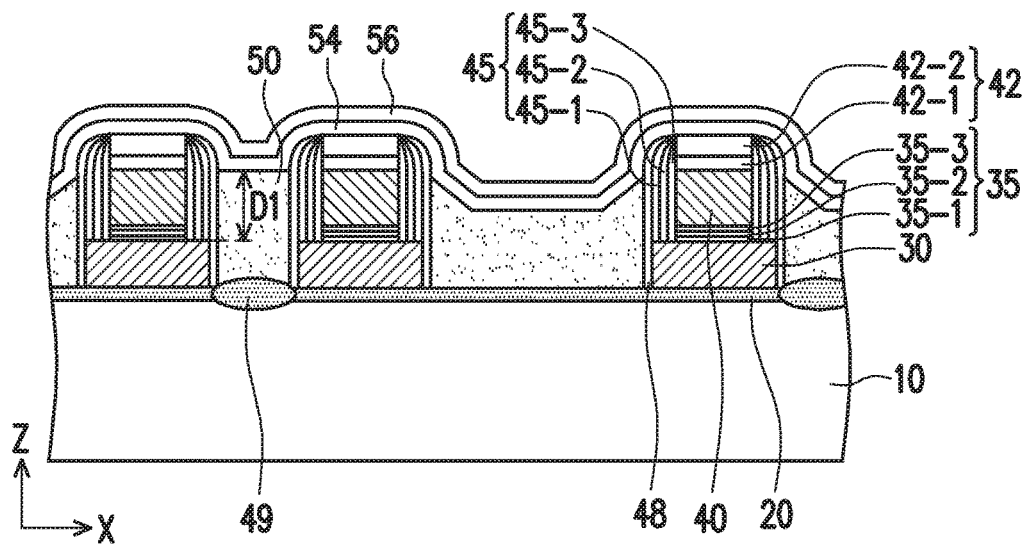
FIG. 10 shows a cross sectional view illustrating one of the various stages of a sequential semiconductor device manufacturing process according to embodiments of the present disclosure.

After the select gate 50S and the erase gates 50E are formed by etching the third polysilicon layer 50, a first cover layer 54 is formed over the structure of FIG. 9A and a second cover layer 56 are formed over the first cover layer 54, as shown in FIG. 10. In some embodiments, the first cover layer 54 is made of a silicon oxide based dielectric material, such as silicon oxide, and the second cover layer 56 is made of a silicon nitride based dielectric material, such as SiN or SiON.

Figure 11:
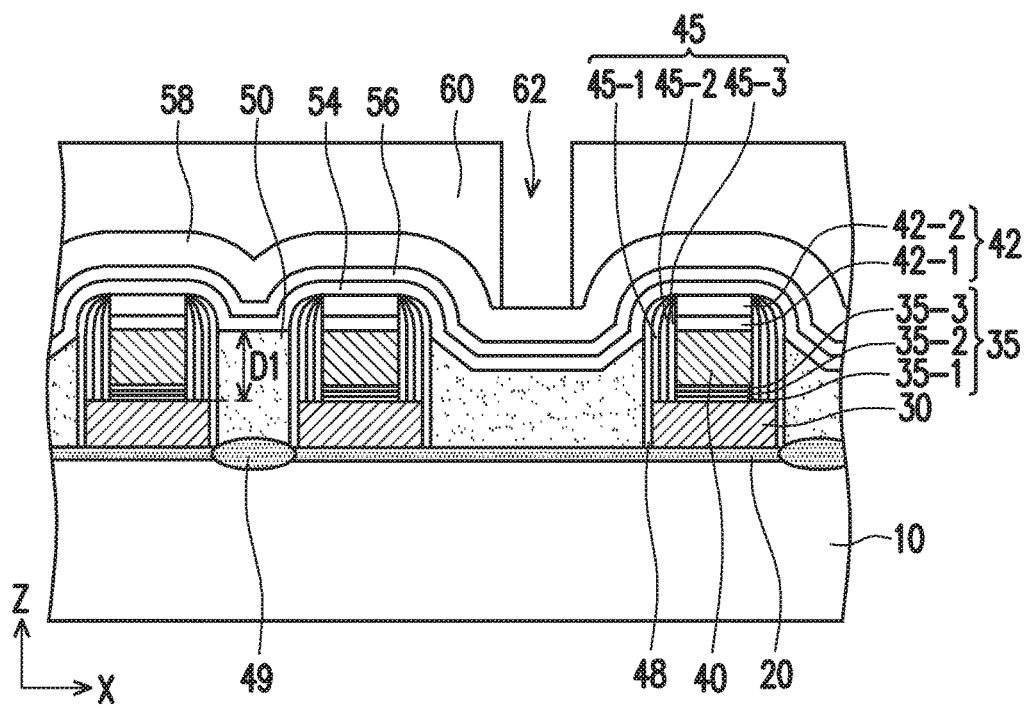
FIG. 11 shows a cross sectional view illustrating one of the various stages of a sequential semiconductor device manufacturing process according to embodiments of the present disclosure.

Further, as shown in FIG. 11, a resist pattern 60 having an opening 62 is formed over the structure of FIG. 10. In some embodiments, a BARC 58 is used under the resist pattern 60.

Figure 12:
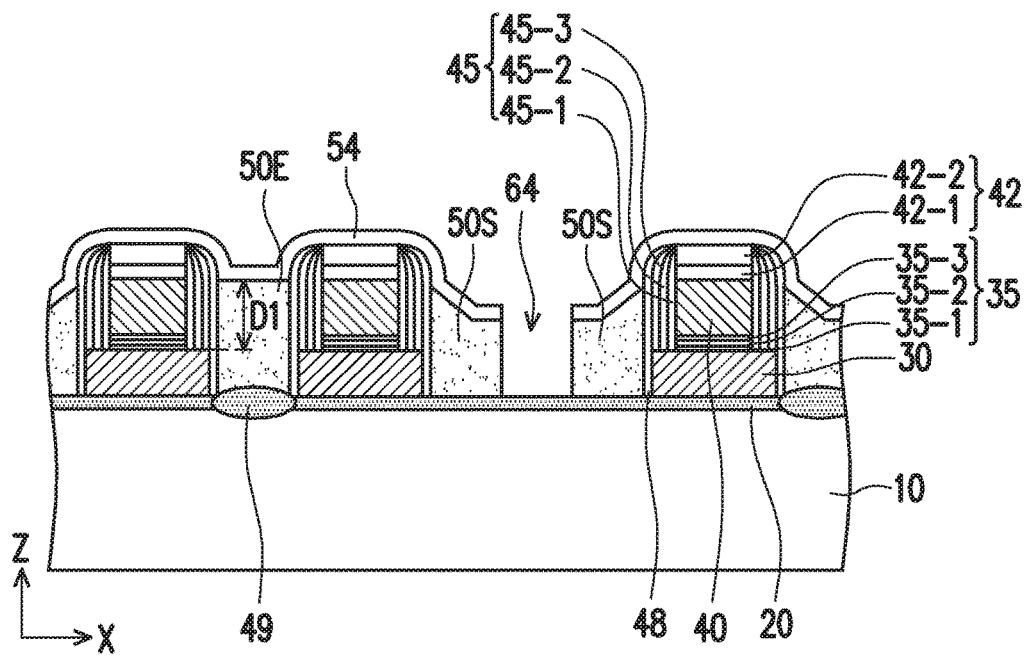
FIG. 12 shows a cross sectional view illustrating one of the various stages of a sequential semiconductor device manufacturing process according to embodiments of the present disclosure.

By using the resist pattern 60 as an etching mask, the first and second cover layers are patterned, and then the third polysilicon layer 50 is patterned, so as to separate the select gates by an opening 64, as shown in FIG. 12. During and/or after the etching of the third polysilicon layer 50, the second cover layer 56 is removed.

Figure 13:
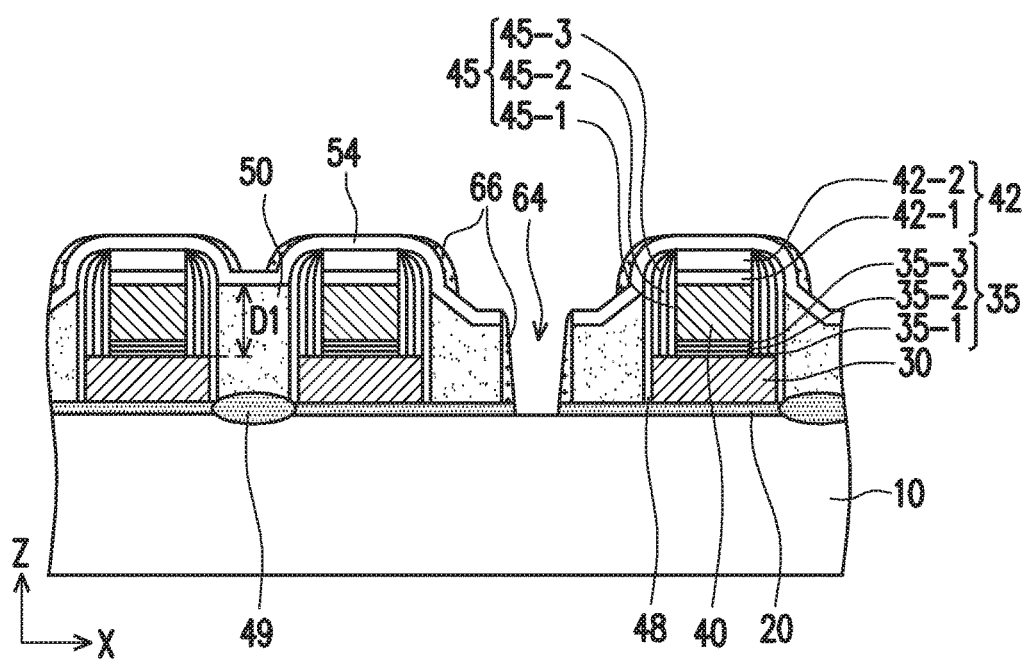
FIG. 13 shows a cross sectional view illustrating one of the various stages of a sequential semiconductor device manufacturing process according to embodiments of the present disclosure.

Subsequently, spacer layers 66 are formed on sidewalls of the opening 64 and other locations, as shown in FIG. 13. The spacer layers 66 are made of a silicon nitride based dielectric material, such as SiN, SiON or SiOCN, and formed by depositing a blanket layer of the dielectric material followed by anisotropic etching.

Figure 14:
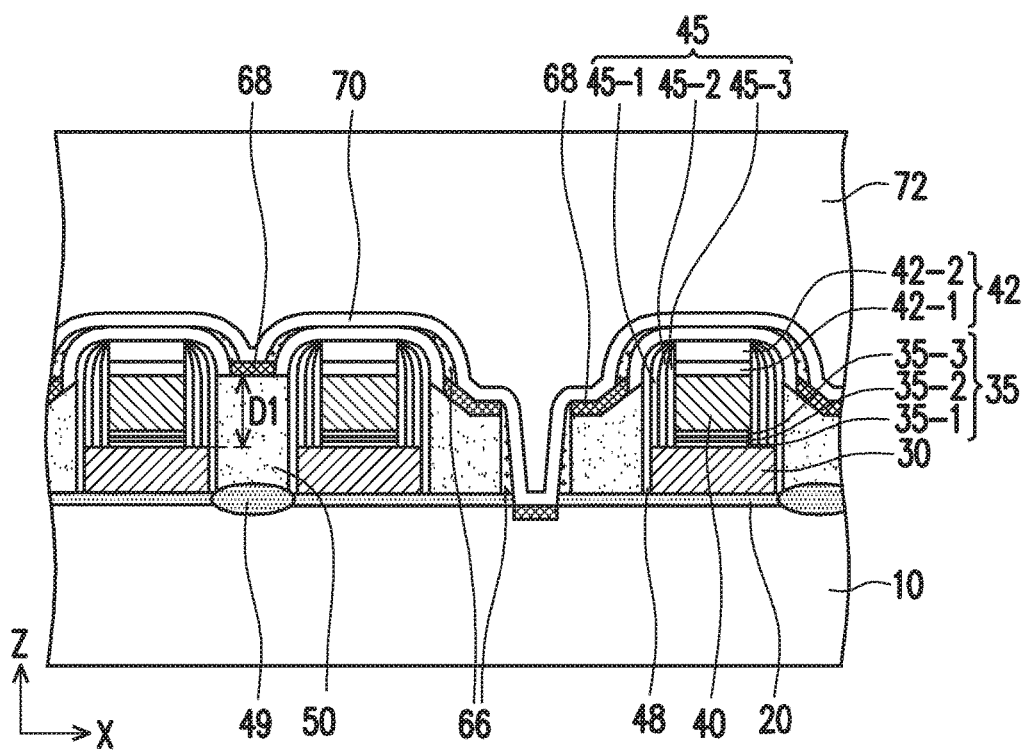
FIG. 14 shows a cross sectional view illustrating one of the various stages of a sequential semiconductor device manufacturing process according to embodiments of the present disclosure.

Further, a silicide layer 68 is formed in the bottom of the opening 64 and on the erase gates 50S and the select gates 50E, a contact etch stop layer (CESL) 70 is formed, and then an interlayer dielectric (ILD) layer 72 is formed, as shown in FIG. 14. The silicide layer 68 is made of one or more of WSi, NiSi, CoSi and TiSi, or other suitable silicide material. When the substrate 10 incudes Ge, germanide or silicide-germanide is formed. The CESL layer 70 is made of a silicon nitride based dielectric material, such as SiN, SiON or SiOCN, formed by CVD in some embodiments. The ILD layer 72 includes one or more layers of SiO$_2$, SiN, SiOC, SiCN, SiOCN or SiON, or any other suitable dielectric material, and can be formed by CVD. The thickness of the ILD layer 72 is in a range from about 50 nm to about 1000 nm in some embodiments.

Figure 15:
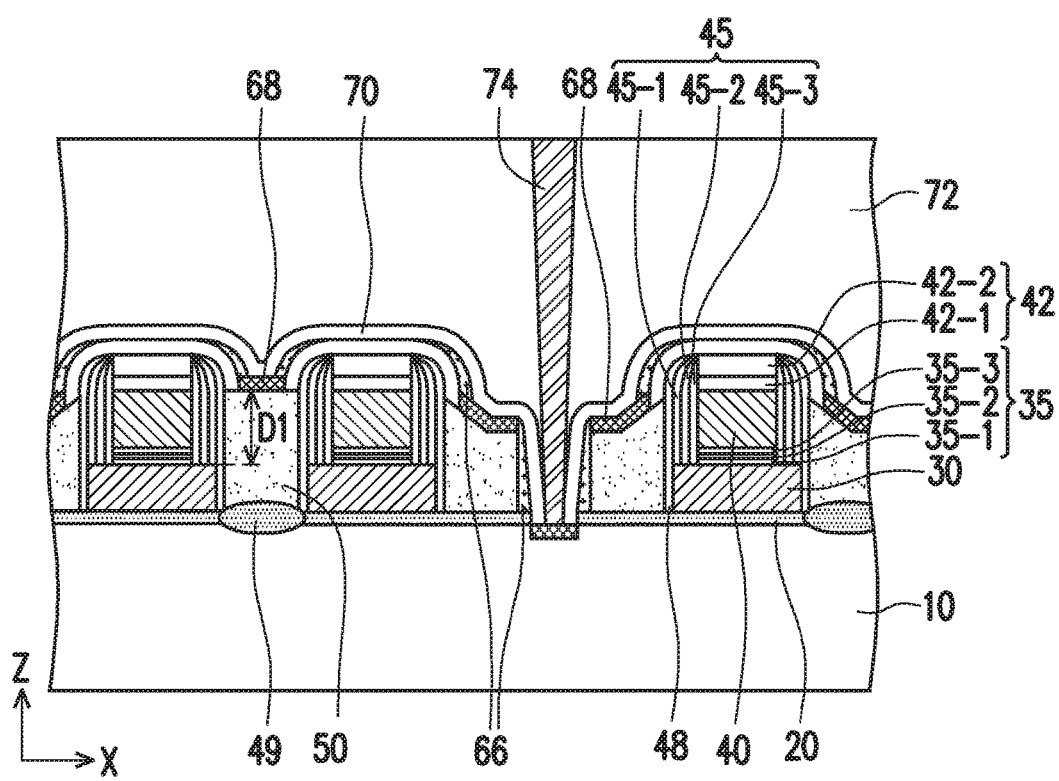
FIG. 15 shows a cross sectional view illustrating one of the various stages of a sequential semiconductor device manufacturing process according to embodiments of the present disclosure.

Then, as shown in FIG. 15, a contact 74 is formed by photolithography, etching and metal deposition operations. In some embodiments, CMP is further utilized to form the contact 74. The contact 74 is made of conductive material including one or more of Al, Cu, W, Ti, Ta, TiN, TiAl, TiAlC, TiAlN, TaN, NiSi, CoSi, and any other suitable conductive materials.

It is understood that the structure shown in FIG. 15 undergoes further CMOS processes to form various features such as interconnect vias, interconnect metal layers, passivation layers, etc.

FIGS. 16-22B generally show cross sectional views illustrating a sequential process for manufacturing a semiconductor device including non-volatile memory cells according to one embodiment of the present disclosure. It is understood that additional operations can be provided before, during, and after processes shown by FIGS. 16-22B, and some of the operations described below can be replaced or eliminated, for additional embodiments of the method. Some elements may not be illustrated for simplicity. The order of the operations may be changeable. Materials, configurations, structures, processes and/or operations same as or similar to those of FIGS. 1-15 may be employed in the following embodiments, and detailed explanation thereof may be omitted.

In the following embodiments, a semiconductor device includes non-volatile memory (NVM) cells and peripheral circuits LG such as logic circuits. In some embodiments, before fabricating the NVM cells and the peripheral logic circuits, a substrate in the NVM cell area is etched to make a "step" between the NVM cell area and the peripheral logic circuit area. The step height corresponds to the height difference when an ILD layer is formed if the step is otherwise not formed.

Figure 16:
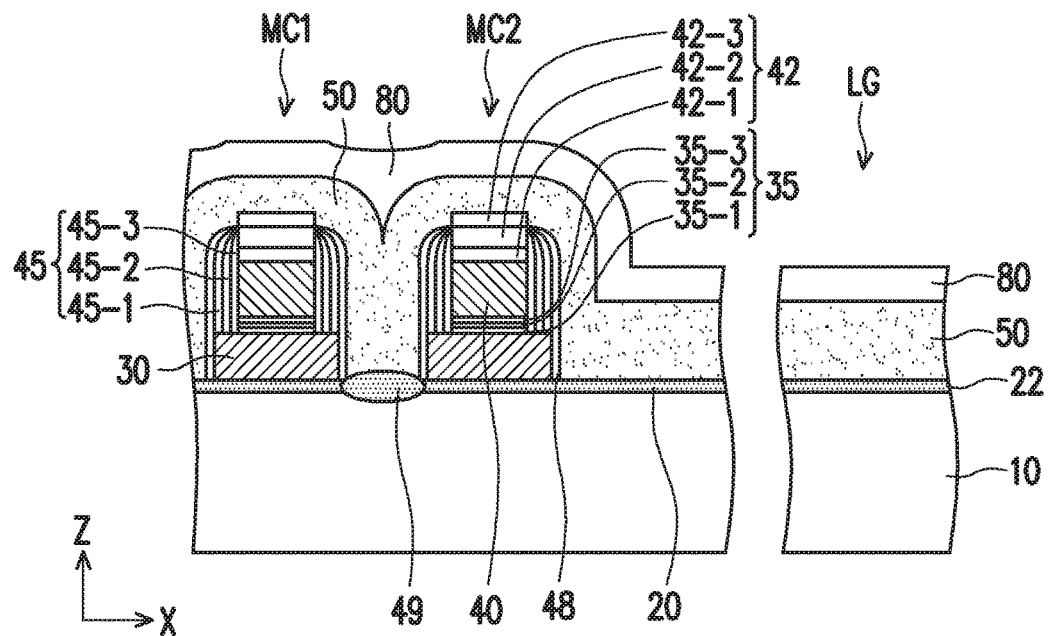
FIG. 16 shows a cross sectional view illustrating one of the various stages of a sequential semiconductor device manufacturing process according to other embodiments of the present disclosure.

As shown in FIG. 16, the third polysilicon layer 50 is formed in the NVM cell area and peripheral logic circuit area. The polysilicon layer 50 for the peripheral logic circuit area may be utilized as a gate electrode or a dummy gate electrode in case a gate replacement technology is used. In the peripheral logic circuit area, a gate dielectric layer 22 is formed on the substrate 10 prior to forming the third polysilicon layer 50. Further, after the third polysilicon layer 50 is formed, a dielectric cover layer 80 is formed both in the NVM cell area and the peripheral logic circuit area. The dielectric cover layer 80 is made of a silicon oxide based material, such as silicon oxide formed from tetraethyl orthosilicate (TEOS), or other suitable dielectric material.

Figure 17:
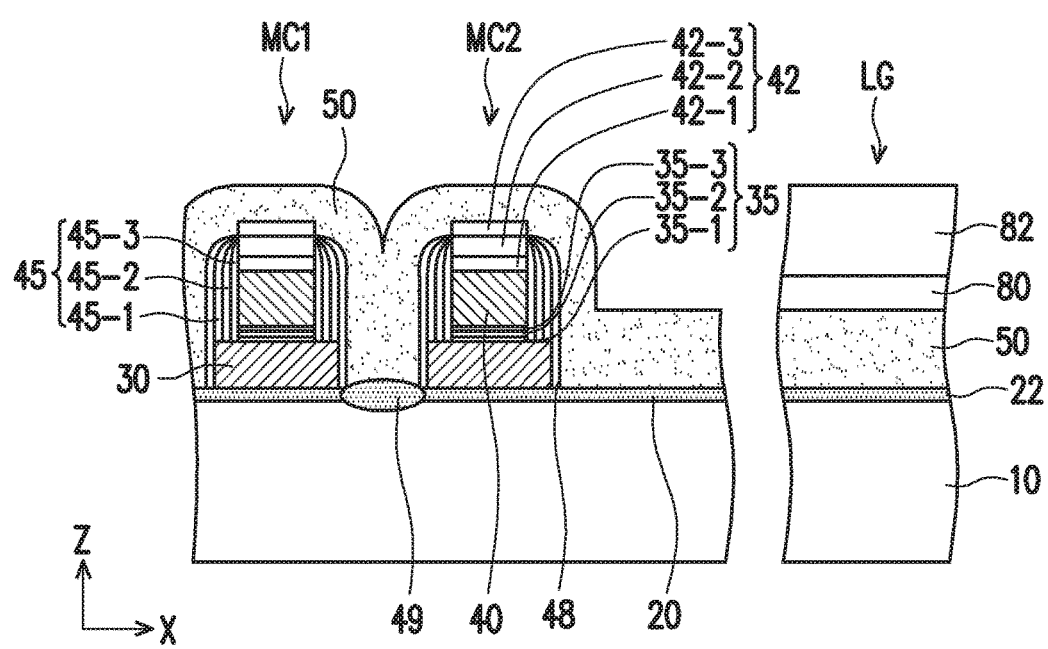
FIG. 17 shows a cross sectional view illustrating one of the various stages of a sequential semiconductor device manufacturing process according to other embodiments of the present disclosure.
Figure 18:
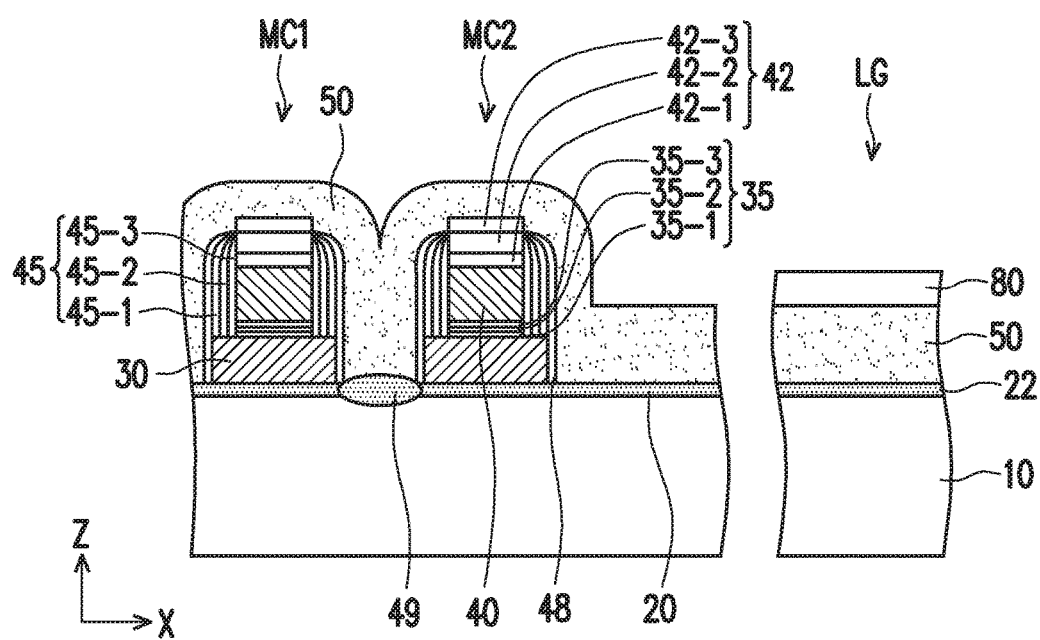
FIG. 18 shows a cross sectional view illustrating one of the various stages of a sequential semiconductor device manufacturing process according to other embodiments of the present disclosure.

After the dielectric cover layer 80 is formed, the peripheral logic circuit area LG is covered by a photo resist 82, and the dielectric cover layer 80 in the NVM cell area is removed, as shown in FIG. 17. Then, as shown in FIG. 18, the photo resist 82 is removed.

Figure 19:
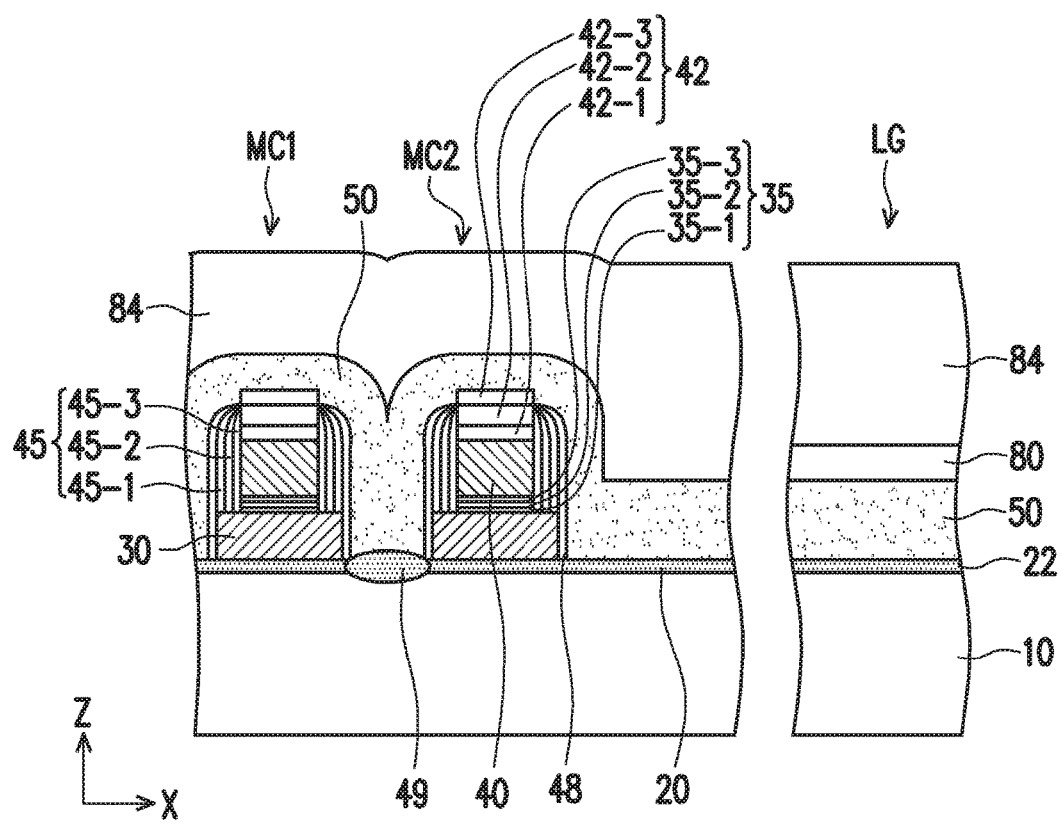
FIG. 19 shows a cross sectional view illustrating one of the various stages of a sequential semiconductor device manufacturing process according to other embodiments of the present disclosure.

Subsequently, a fourth polysilicon layer 84 is formed in the NVM cell area and peripheral logic circuit area, as shown in FIG. 19.

Figure 20:
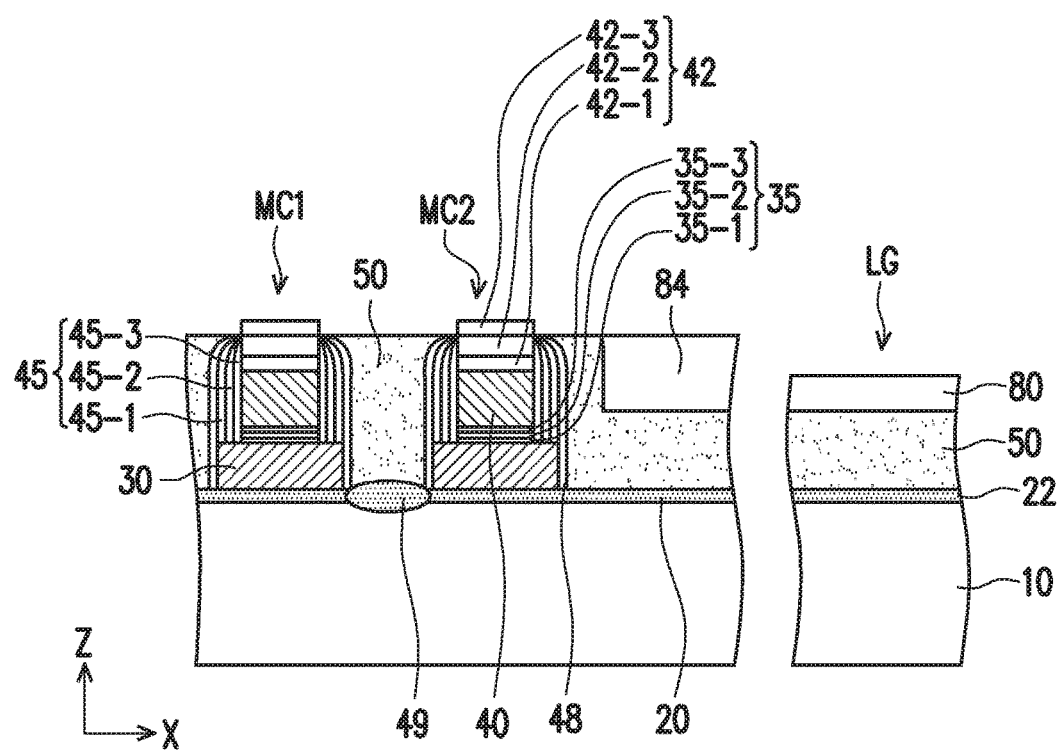
FIG. 20 shows a cross sectional view illustrating one of the various stages of a sequential semiconductor device manufacturing process according to other embodiments of the present disclosure.

Then, a planarization operation, such as CMP, is performed to remove upper portions of the fourth polysilicon layer 84 and the third polysilicon layer 50, so that the hard mask layer 42 is exposed, as shown in FIG. 20. In some embodiments, due to a difference in polishing rates, the hard mask layers 42 slightly protrude from the polysilicon layers.

Figure 21:
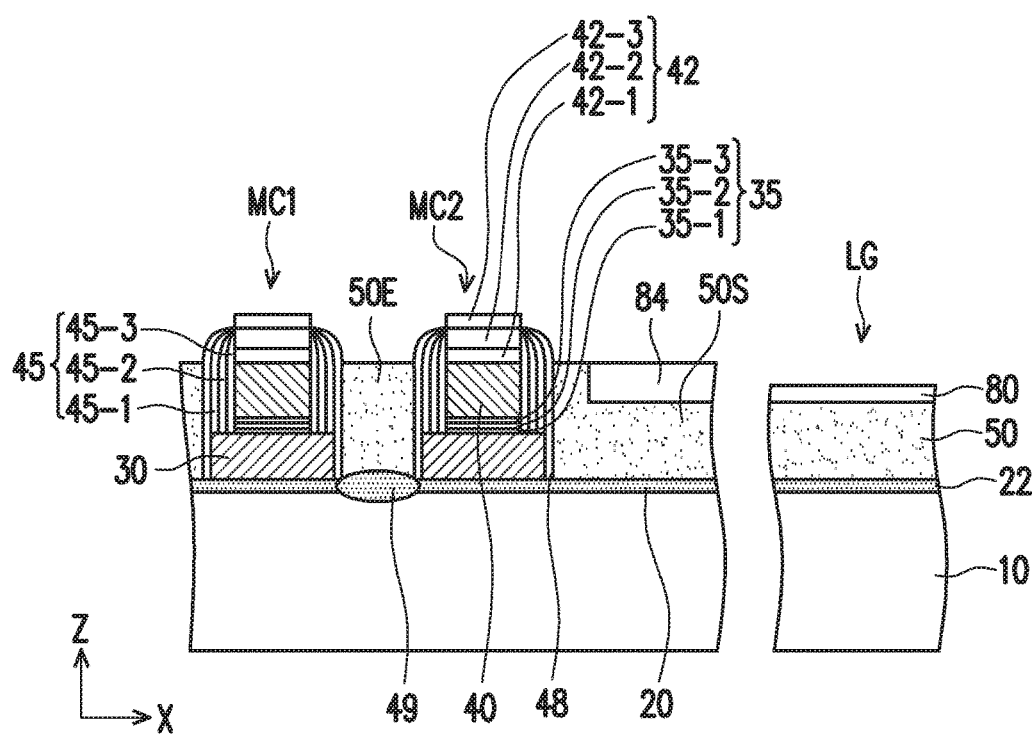
FIG. 21 shows a cross sectional view illustrating one of the various stages of a sequential semiconductor device manufacturing process according to other embodiments of the present disclosure.

Further, as shown in FIG. 21, an etch-back operation is performed to further reduce the thickness of the third polysilicon layer similar to the operation of FIG. 9A.

By the CMP operation and/or the etch-back operation, the fourth polysilicon layer 84 in the peripheral logic circuit area is substantially fully removed.

Figure 22A:
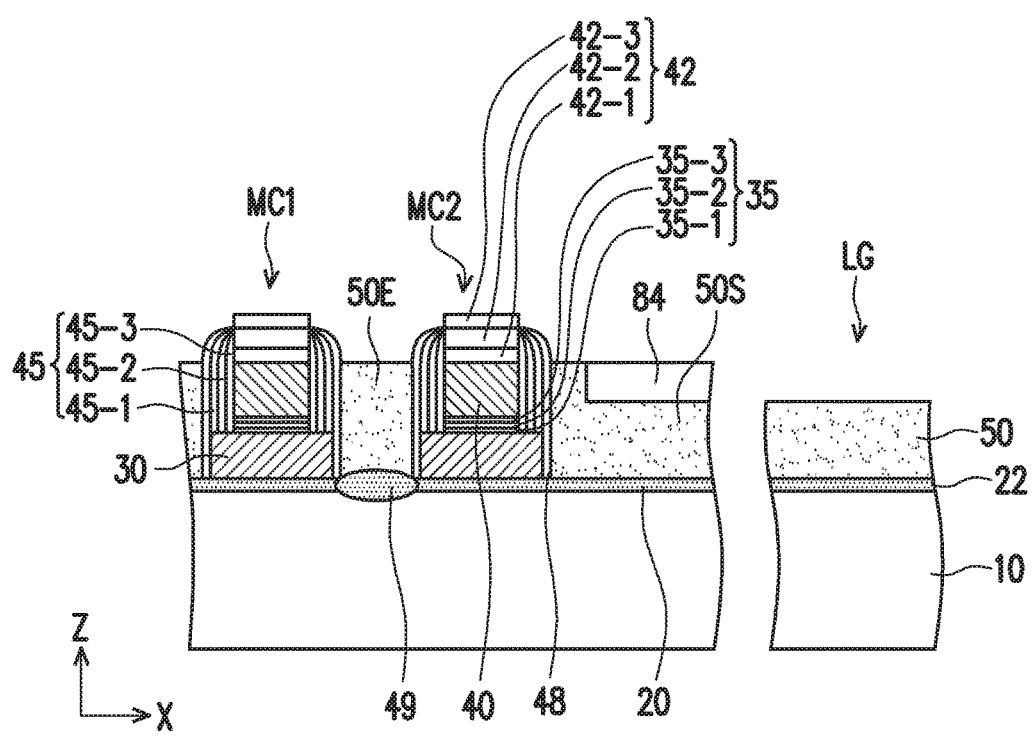
FIGS. 22A and 22B show cross sectional views illustrating one of the various stages of a sequential semiconductor device manufacturing process according to other embodiments of the present disclosure.

Then, as shown in FIG. 22A, the dielectric cover layer 80 in the peripheral logic circuit area is removed, thereby the third polysilicon layer is exposed so that subsequent operations can be performed on the third polysilicon layer 50.

Figure 22B:
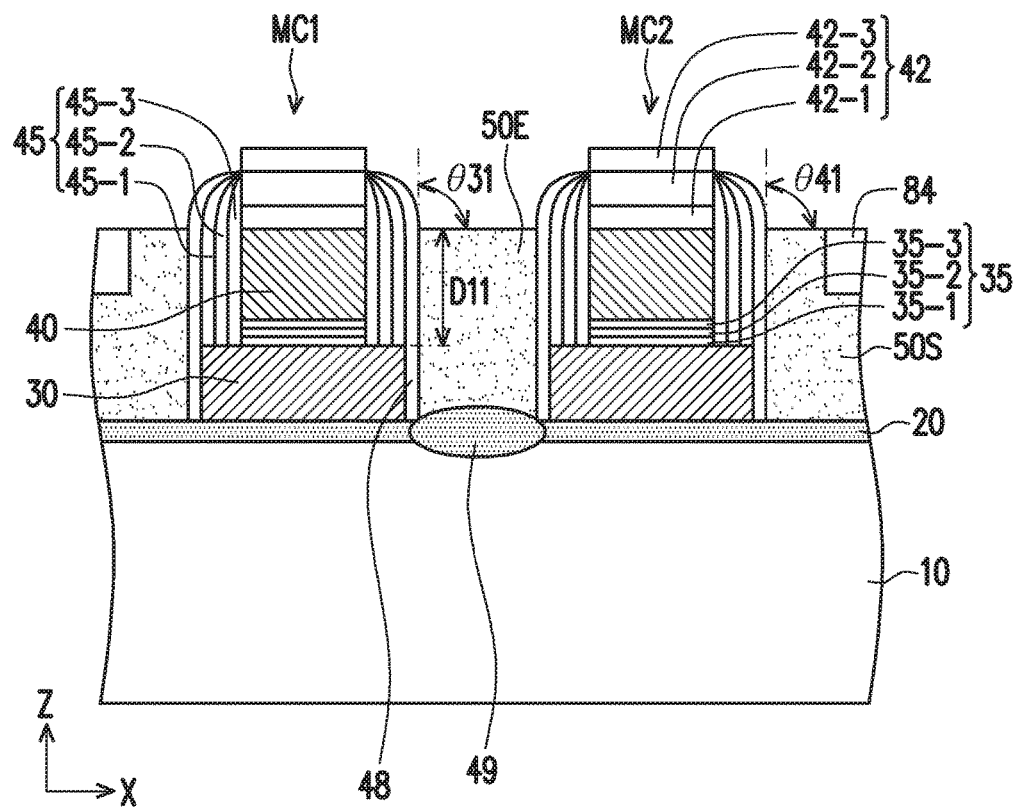

As shown in FIG. 22B, similar to FIG. 9B-9D, an upper surface of the erase gate 50E (polysilicon layer 50) and one of the second sidewall spacers 48 (e.g., the right side of the structure MC1) in contact with the erase gate 50E form an angle θ31 at a contact point of the upper surface of the erase gate 50E and the one of the sidewall spacers 48, where 90°<θ31<120° measured from the upper surface of the erase gate. In other embodiments, 90°<θ31<115°.

Further, the thickness D1 of the erase gate 50E measured from a level of the upper surface of the floating gate (polysilicon layer 30) to the contact point is sufficiently large to cover the sidewall spacer 48 covering the control gate 40. In some embodiments, the thickness D11 is greater than the sum of the thicknesses of the second dielectric layer 35 and the control gate (second polysilicon layer 40). In some embodiments, D1 is in a range from about 45 nm to about 80 nm.

Similarly, the upper surface of the select gate 50S (polysilicon layer 50) and one of the second sidewall spacers 48 (e.g., the right side of the structure MC2) in contact with the select gate 50S form an angle θ41 at a contact point of the upper surface of the select gate 50S and the one of the sidewall spacers 48, where 90°<θ41<130° measured from the upper surface of the select gate. In other embodiments, 90°<θ41<125°.

In some embodiments, the upper surface of the erase gate 50E is substantially flat (variation is less than 3 nm) with respect to the principal surface of the substrate 10, while 90°<θ31<115°. In other embodiments, the upper surface of the erase gate 50E has a V-shape, U-shape and/or a concave shape cross section in the X direction.

It is understood that the structure shown in FIG. 22A undergoes further manufacturing operations as explained above with FIGS. 10-15, and undergoes further CMOS processes to form various features such as interconnect vias, interconnect metal layers, passivation layers, etc.

Further, the manufacturing operations for the peripheral logic circuit area LG as explained above with FIGS. 16-22A may be applied to the manufacturing operations as explained above with FIGS. 1-15.

It will be understood that not all advantages have been necessarily discussed herein, no particular advantage is required for all embodiments or examples, and other embodiments or examples may offer different advantages.

According to some embodiments of the present disclosure, by controlling the surface profile of the erase gate, the endurance property can be improved by about 40% in terms of a voltage shift between an initial state and a post-stress state, and the cell erase time can be improved by about 20%.

In accordance with one aspect of the present disclosure, in a method for manufacturing a semiconductor device includes a non-volatile memory, a stacked structure is formed over a substrate. The stacked structure includes a first polysilicon layer and a second polysilicon layer. Sidewall spacers are formed on opposing sides of the stacked structure. A third polysilicon layer is formed over the stacked structure, thereby covering the stacked structure. An upper portion of the third polysilicon layer is removed, thereby forming a select gate and an erase gate. An upper surface of the erase gate and one of the sidewall spacers in contact with the erase gate form an angle θ1 at a contact point of the upper surface of the erase gate and the one of the sidewall spacers, where 90°<θ1<115° measured from the upper surface of the erase gate.

In accordance with another aspect of the present disclosure, a semiconductor device includes a non-volatile memory. The non-volatile memory includes a stacked gate structure including a floating gate and a control gate, sidewall spacers disposed on opposing sides of the stacked structure, and an erase gate and a select gate disposed on sides of the stacked structure, respectively. An upper surface of the erase gate and one of the sidewall spacers in contact with the erase gate form an angle θ1 at a contact point of the upper surface of the erase gate and the one of the sidewall spacers, where 90°<θ1<115° measured from the upper surface of the erase gate.

In accordance with another aspect of the present disclosure, a semiconductor device includes a non-volatile memory. The non-volatile memory includes a stacked gate structure including a floating gate and a control gate, sidewall spacers disposed on opposing sides of the stacked structure, and an erase gate and a select gate disposed on sides of the stacked structure, respectively. An upper surface of the erase gate and a horizontal plane parallel to a surface of the substrate makes an angle θ at the contact point of the upper surface of the erase gate and the one of the sidewall spacers, where −15°<θ<10° measured from the horizontal plane.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device including a non-volatile memory, the method comprising:
    forming, over a substrate, a stacked structure including at least a first polysilicon layer and a second polysilicon layer;
    forming sidewall spacers on opposing sides of the stacked structure,
    wherein the sidewall spacers are simultaneously disposed over opposing sides of the first polysilicon layer and second polysilicon layer;
    forming a third polysilicon layer over the stacked structure, thereby covering the stacked structure;
    removing an upper portion of the third polysilicon layer, thereby forming a select gate and an erase gate,
    wherein an upper surface of the erase gate and one of the sidewall spacers in contact with the erase gate form an angle θ1 at a contact point of the upper surface of the erase gate and the one of the sidewall spacers, where 90°<θ1<115° measured from the upper surface of the erase gate.

2. The method of claim 1, wherein the one of the sidewall spacers is inclined toward a select gate side with respect to a normal line to a surface of the substrate, making an angle θ2 between the one of the sidewall spacers and the normal line.

3. The method of claim 2, wherein 0°<θ2<10° measured from the normal line.

4. The method of claim 2, wherein the upper surface of the erase gate and a horizontal plane parallel to the surface of the substrate make an angle θ3 at the contact point of the upper surface of the erase gate and the one of the sidewall spacers, where −15°<θ3<10° measured from the horizontal plane.

5. The method of claim 1, wherein the forming the stacked structure comprises:
forming a first dielectric layer over a substrate;
forming a first polysilicon film for the first polysilicon layer over the first dielectric layer;
forming a second dielectric film over the first polysilicon film;
forming a second polysilicon film for the second polysilicon layer over the second dielectric film;
patterning the second polysilicon film and the second dielectric film, thereby forming the second polysilicon layer and a second dielectric layer;
after the second polysilicon layer and the second dielectric layer are formed, patterning the first polysilicon film, thereby forming the first polysilicon layer.

6. The method of claim 5, wherein:
the sidewall spacers include first sidewall spacers and second sidewall spacers, and
the forming the stacked structure further comprises:
after the second polysilicon film and the second dielectric film are patterned and before the first polysilicon film is patterned, forming the first sidewall spacers on opposing sides of the second polysilicon layer and the second dielectric layer, and
after the first polysilicon film is patterned, forming the second sidewall spacers over opposing sides of the first polysilicon layer and the second polysilicon layer.

7. The method of claim 6, wherein the first sidewall spacers have a three layer structure including at least one silicon nitride layer and at least one silicon oxide layer.

8. The method of claim 1, wherein:
the stacked structure further includes a cap insulating layer, and
the removing an upper portion of the third polysilicon layer comprises:
forming a fourth polysilicon layer over the third polysilicon layer;
performing a first planarization operation to partially remove the third and fourth polysilicon layers, thereby exposing the cap insulating layer; and
performing a second planarization operation to further reduce a thickness of the third and fourth polysilicon layers, thereby forming the select gate and the erase gate.

9. The method of claim 8, wherein the first planarization operation includes a chemical mechanical polishing operation.

10. The method of claim 8, wherein the second planarization operation includes an etch-back operation using a plasma process.

11. A method for manufacturing a semiconductor device including a non-volatile memory, the method comprising:
forming, over a substrate, a stacked structure including at least a first polysilicon layer and a second polysilicon layer;
forming sidewall spacers on opposing sides of the stacked structure;
forming a third polysilicon layer over the stacked structure, thereby covering the stacked structure;
removing an upper portion of the third polysilicon layer, thereby forming a select gate and an erase gate,
wherein an upper surface of the erase gate and one of the sidewall spacers in contact with the erase gate form an angle θ1 at a contact point of the upper surface of the erase gate and the one of the sidewall spacers, where 90°<θ1<115° measured from the upper surface of the erase gate,
wherein:
the stacked structure further includes a cap insulating layer, and
the removing an upper portion of the third polysilicon layer comprises:
forming a planarization layer over the third polysilicon layer;
performing a first etch-back operation using a first plasma process to partially remove the planarization layer and the third polysilicon layer, thereby exposing the cap insulating layer; and
performing a second etch-back operation using a second plasma process to further reduce a thickness of the third polysilicon layer, thereby forming the select gate and the erase gate.

12. The method of claim 11, wherein the planarization layer is made of an organic material.

13. The method of claim 12, wherein the organic material has an attenuation coefficient between 0.2 to 0.6 with respect to 248 nm or 193 nm light.

14. A method for manufacturing a semiconductor device including a non-volatile memory, the method comprising:
forming, over a substrate, a stacked structure including at least a first polysilicon layer and a second polysilicon layer;
forming sidewall spacers on opposing sides of the stacked structure;
forming a third polysilicon layer over the stacked structure, thereby covering the stacked structure;
removing an upper portion of the third polysilicon layer, thereby forming a select gate and an erase gate,
wherein one of the sidewall spacers is inclined toward a select gate side with respect to a normal line to a surface of the substrate, making an angle θ2 between the one of the sidewall spacers and the normal line, wherein 0°<θ2<10° measured from the normal line.

15. The method of claim 14, wherein the forming the stacked structure comprises:
forming a first dielectric layer over a substrate;
forming a first polysilicon film for the first polysilicon layer over the first dielectric layer;
forming a second dielectric film over the first polysilicon film;
forming a second polysilicon film for the second polysilicon layer over the second dielectric film;
patterning the second polysilicon film and the second dielectric film, thereby forming the second polysilicon layer and a second dielectric layer; and
after the second polysilicon layer and the second dielectric layer are formed, patterning the first polysilicon film, thereby forming the first polysilicon layer;
after the second polysilicon film and the second dielectric film are patterned and before the first polysilicon film is patterned, forming first sidewall spacers on opposing sides of the second polysilicon layer and the second dielectric layer,
wherein the first sidewall spacers have a three layer structure including at least one silicon nitride layer and at least one silicon oxide layer.

16. The method of claim 14, wherein:
the stacked structure further includes a cap insulating layer, and
the removing an upper portion of the third polysilicon layer comprises:
forming a planarization layer over the third polysilicon layer;

performing a first etch-back operation using a first plasma process to partially remove the planarization layer and the third polysilicon layer, thereby exposing the cap insulating layer; and performing a second etch-back operation using a second plasma process to further reduce a thickness of the third polysilicon layer, thereby forming the select gate and the erase gate.

17. The method of claim 16, wherein the planarization layer is made of an organic material having an attenuation coefficient between 0.2 to 0.6 with respect to 248 nm or 193 nm light.

18. The method of claim 14, wherein:

the stacked structure further includes a cap insulating layer, and the removing an upper portion of the third polysilicon layer comprises:

forming a fourth polysilicon layer over the third polysilicon layer;

performing a first planarization operation to partially remove the third and fourth polysilicon layers, thereby exposing the cap insulating layer; and performing a second planarization operation to further reduce a thickness of the third and fourth polysilicon layers, thereby forming the select gate and the erase gate, wherein the first planarization operation and the second planarization operation include a chemical mechanical polishing operation, an etch-back operation using a plasma process or both.

19. A method for manufacturing a semiconductor device including a non-volatile memory, the method comprising:

forming, over a substrate, a stacked structure including at least a first polysilicon layer and a second polysilicon layer;

forming sidewall spacers on opposing sides of the stacked structure;

forming a third polysilicon layer over the stacked structure, thereby covering the stacked structure;

forming a planarization layer over the third polysilicon layer; and forming a select gate and an erase gate by removing the planarization layer and an upper portion of the third polysilicon layer by using a planarization operation including an etch-back operation using a plasma process, wherein during the etch-back operation an etching rate of the third polysilicon layer during the etch-back operation is ER1, an etching rate of the planarization layer is ER2, and 0.5<ER1/ER2<2.0 to control the erase gate profile.

20. The method of claim 19, the forming sidewall spacers on opposing sides of the stacked structure comprises forming first sidewall spacers over opposing sides of the second polysilicon layer and forming second sidewall spacers over the first sidewall spacers and the opposing sides of the first polysilicon layer.

* * * * *